(12) United States Patent
Zhang (10) Patent No.: US 11,448,693 B2
(45) Date of Patent: Sep. 20, 2022

(54) TEST SYSTEM FOR IMPROVING TEST STABILITY

(71) Applicants: Inventec (Pudong) Technology Corporation, Shanghai (CN); INVENTEC CORPORATION, Taipei (TW)

(72) Inventor: Lin Zhang, Shanghai (CN)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 86 days.

(21) Appl. No.: 17/013,667

(22) Filed: Sep. 7, 2020

(65) Prior Publication Data

US 2021/0072306 A1 Mar. 11, 2021

(30) Foreign Application Priority Data

Sep. 9, 2019 (CN) .......................... 201910857781.9

(51) Int. Cl.
*G01R 31/28* (2006.01)
*G01R 31/67* (2020.01)
*G01R 31/70* (2020.01)

(52) U.S. Cl.
CPC ....... *G01R 31/2886* (2013.01); *G01R 31/281* (2013.01); *G01R 31/67* (2020.01); *G01R 31/70* (2020.01)

(58) Field of Classification Search
CPC ................ H01R 2201/20; H01R 13/26; H01R 13/6205; H01R 13/6582; H01R 13/6585; H01R 12/71; H01R 43/26; H01R 13/629; H01R 13/652; H01R 12/725; H01R 13/625; H01R 13/646; H01R 12/722; H01R 13/6597; H01R 13/10; H01R 12/57; H01R 24/20; H01R 13/562; H01R 24/068; G01R 31/2808; G01R 31/281; G01R 31/2886; G01R 31/67; G01R 31/68; G01R 31/70
See application file for complete search history.

(56) References Cited

U.S. PATENT DOCUMENTS

| 6,088,752 | A | * | 7/2000 | Ahern | G06F 1/1632 710/2 |
|---|---|---|---|---|---|
| 6,357,023 | B1 | * | 3/2002 | Co | G01R 31/31905 714/42 |
| 7,206,703 | B1 | * | 4/2007 | Papageorgiou | G01R 31/11 702/58 |
| 9,705,269 | B2 | * | 7/2017 | Zhang | H01R 13/502 |
| 9,996,130 | B2 | * | 6/2018 | Rhee | G06F 1/266 |
| 10,168,378 | B2 | * | 1/2019 | Kim | G06F 11/00 |
| 10,855,012 | B2 | * | 12/2020 | Lim | G06F 11/3027 |
| 2013/0106454 | A1 | * | 5/2013 | Liu | G01R 31/2808 324/750.25 |
| 2022/0011382 | A1 | * | 1/2022 | Chiang | G01R 19/16576 |

* cited by examiner

*Primary Examiner* — Vinh P Nguyen (57) ABSTRACT

The disclosure relates to a test system for improving test stability. One end of the connection pin is fixed to a bottom surface of a corresponding pin socket, the bottom surface is near an end of the plug end, the other end of each connection pin is disposed in the corresponding pin socket and a portion of the other end of the connection pin protrudes from a top surface of an end of the plug end. The connection pin in the plug end will not be deformed by external force, which can avoid the deformation of the connection pin caused by external force, and ensure the electrical connection and test stability.

6 Claims, 9 Drawing Sheets

TEST SYSTEM FOR IMPROVING TEST STABILITY

CROSS REFERENCES TO RELATED APPLICATIONS

This application claims the benefit of priority to Chinese Patent Application No. CN201910857781.9, entitled "Test System for Improving Test Stability", filed with CNIPO on Sep. 9, 2019, the contents of which are incorporated herein by reference in its entirety.

TECHNICAL FIELD

The present disclosure relates to a test system, in particular, to a test system which improves test stability by improving the configuration of connection pins in an adapter card.

BACKGROUND

Figure 1:
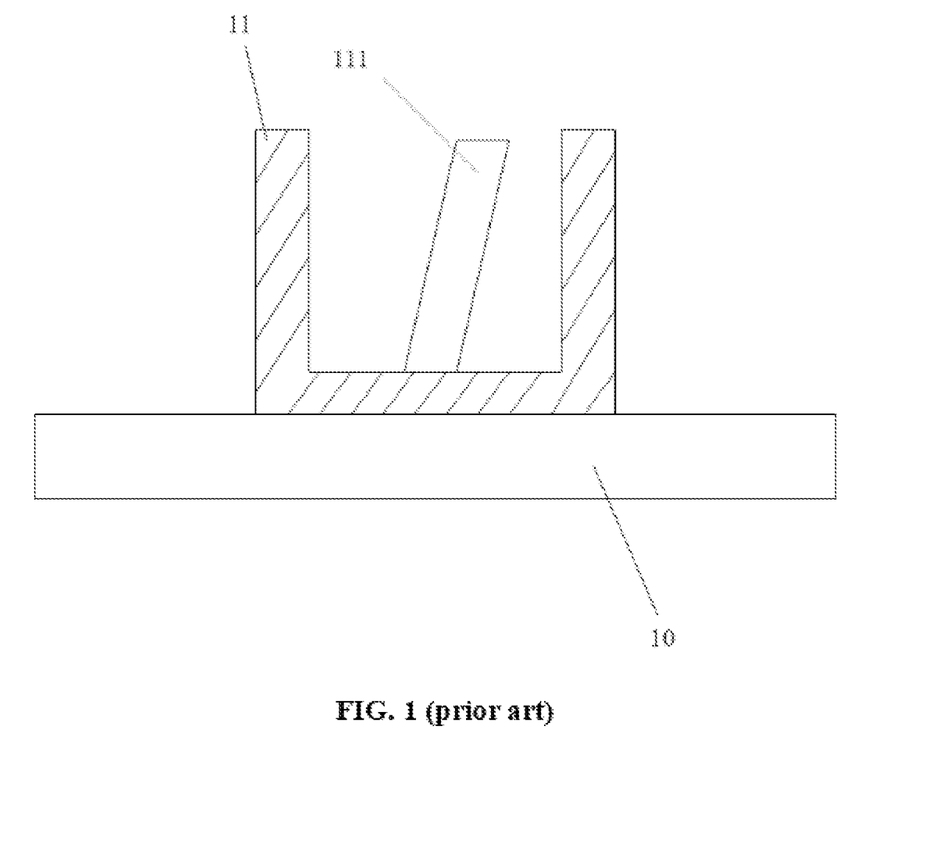
FIG. 1 is a cross sectional view of a connection socket to be tested which is tested by an adapter card in the prior art.

Please referring to FIG. 1, FIG. 1 is a cross-sectional view of a connection socket to be tested by an adapter card in the prior art.

The circuit board to be tested 10 has at least one connection socket to be tested 11, and the connection socket to be tested 11 is a Universal Serial Bus (USB) female socket.

The electrical connection portion 111 in the connection socket 11 of the circuit board to be tested 10 may deviate or tilt due to production tolerances, assembly tolerances. The deviation and tilt of the electrical connection portion 111 in the connection socket to be tested 11 in FIG. 1 is presented and illustrated in an obvious form. The deviation or tilt of the electrical connection portion 111 in the connection socket to be tested 11 is not as obvious as that in FIG. 1.

Figure 2A:
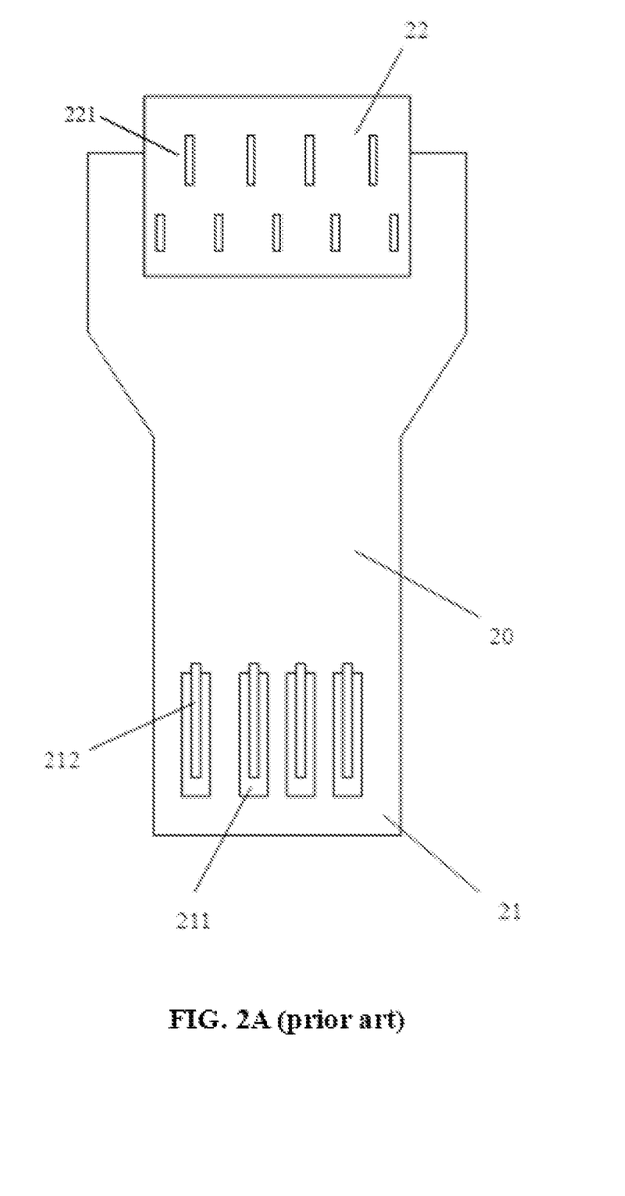
FIG. 2A is a drawing of an adapter to be tested which is tested by an adapter card in the prior art.
Figure 2B:
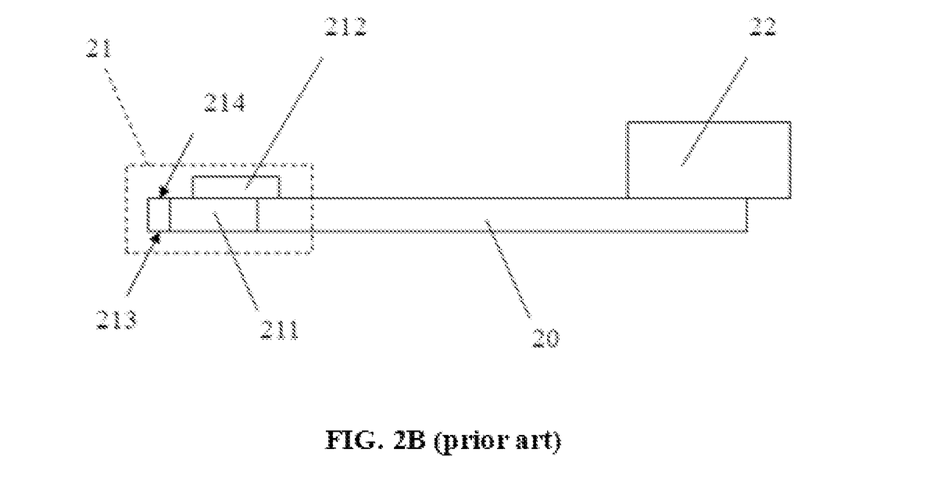
FIG. 2B is a cross sectional view of an adapter card tested by an adapter in the prior art.

Please referring to FIG. 2A and FIG. 2B, FIG. 2A is a planar view of the adapter card tested by the adapter card in the prior art; FIG. 2B is cross sectional view of the adapter card tested by the adapter card in the prior art.

The plug end 21 of the adapter card 20 has a plurality of pin sockets 211 and a plurality of connection pins 212. One end of each connection pin 212 is fixed to the top surface 214 of the corresponding pin socket 211 away from the end of the plug end 21, the other end of the connection pin 212 is disposed above the corresponding pin socket 211, and the plug end 21 of the adapter card 20 is used to plug in the connection socket to be tested 11 of the circuit board to be tested 10.

Each pin position in adapter socket 22 of adapter card 20 is electrically connected with one of the connection pin 212 of plug end 21. It should be noted that the connection pin 212 in the plug end 21 is universal serial bus interface, and the adapter socket 22 of adapter card 20 is also a universal serial bus female socket.

Figure 3A:
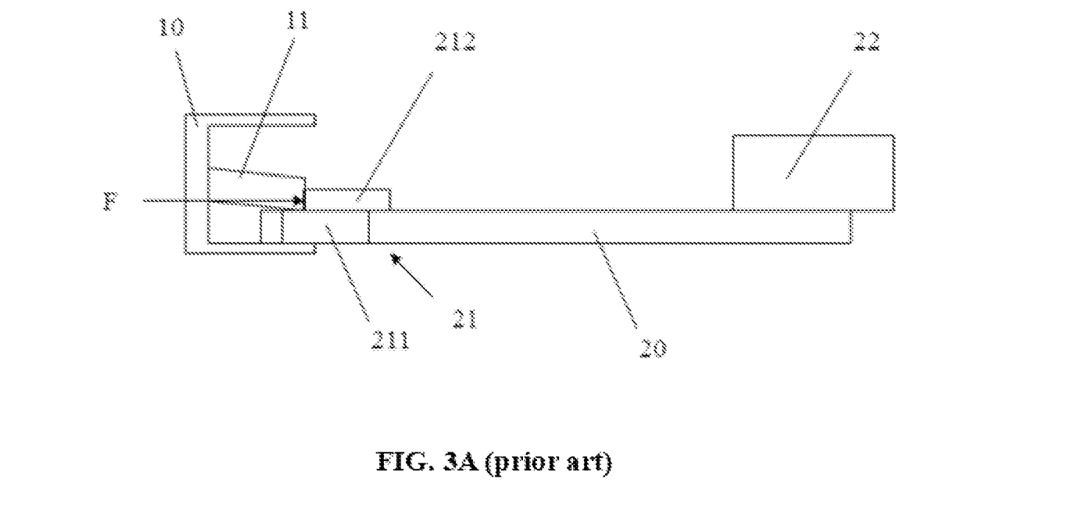
FIG. 3A and FIG. 3B are flow charts of the plug-in process of the connection socket to be tested and adapter card tested through an adapter card in the prior art.
Figure 3B:
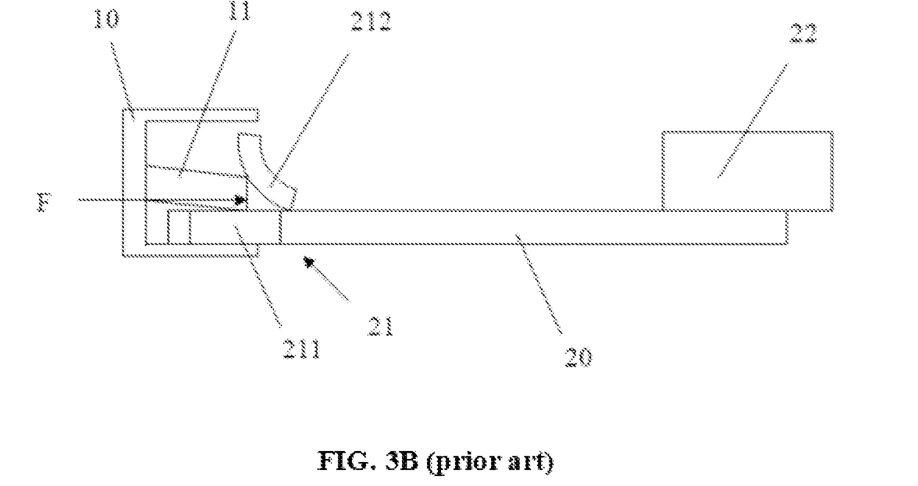

Please referring to FIG. 3A and FIG. 3B, FIG. 3A and FIG. 3B are the plug-in process of the connection socket to be tested with the adapter card tested by the adapter card in the prior art.

FIGS. 3A-3B are the plug-in process of the connection pins 212 of the plug end 21 plugged-in the connection socket to be tested 11 on the circuit board to be tested 10. In the plug end 21, the connection pins 212 are plugged into the connection socket to be tested 11 of the circuit board to be tested 10. The electrical connection portion 111 in the connection socket to be tested 11 is contacted with the connection pin 212 in the plug end 21. One end of the connection pin 212 in the plug end 21 is fixed to the top surface 214 of the corresponding pin socket 211, the top surface 214 is away from the plug end 21. In the original design, when subjected to an external force F, the connection pin 212 of the plug end 21 will move downwards and cause the other end of the connection pin 212 to be placed in the pin socket 211 of the plug end 21. But in the original design, the connection pin 212 in the plug end 21 may be squeezed when subjected to the external force F, so that the other end of the connection pin 212 is not placed in the pin socket 211 of the plug end 21. The connection pin 212 in the plug end 21 is deformed by extrusion, which will cause the connection pin 212 to be electrically disconnected, further prevent the test from being performed.

In summary, it is well known in the prior art that the conventional connection pins are susceptible to deform by external force, consequently cannot perform electrical connection and the following test. Therefore, it is necessary to provide an improved technical means to solve this problem.

SUMMARY

The present disclosure provides a test system for improving test stability. The test system includes: a circuit board to be tested, adapter card and testing device.

The circuit board to be tested has at least one connection socket to be tested.

The plug end of the adapter card has a plurality of pin sockets and a plurality of connection pins, and one end of each connection pin is fixed to a bottom surface of the corresponding pin socket, the bottom surface is near the end of the plug end, the other end of each connection pin is disposed in the corresponding pin socket and portion of the other end of the connection pin protrudes from the top surface of the end of the plug end, the plug end is plugged into the connection socket to be tested; each pin position in the adapter socket of the adapter card is electrically connected to one of the connection pins in the plug end.

The testing device is plugged into the adapter socket to form an electrical connection, so that the circuit board to be tested is tested by the adapter card.

Preferably, the connection socket to be tested is a Universal Serial Bus (USB) female socket.

Preferably, the plurality of connection pins of the plug end are USB interfaces.

Preferably, the adapter socket is a USB interface.

Preferably, the testing device is plugged to the adapter socket through a connection line of the USB interface, so as to form electrically connection, thereby testing the circuit board to be tested through the adapter card.

Preferably, the adapter card is a multilayer circuit board.

Preferably, each pin position in the transfer socket is electrically connected with one of the connection pins in the plug end in a circuit board of the inner layer of the adapter card.

Preferably, each pin position in the transfer socket is electrically connected with one of the connection pins in the plug end in a circuit board of the outer layer of the adapter card.

In the present disclosure, one end of the connection pin is fixed to a bottom surface of the corresponding pin socket, the bottom surface is near the end of the plug end, the other end of each connection pin is disposed in the corresponding pin socket and portion of the other end of the connection pin protrudes from the top surface of the end of the plug end, so that the connection pins in the plug end will not be deformed by external force.

Through the above technical solutions, the present disclosure can avoid the deformation of connection pin caused by external force, thereby securing electrically connection and test stability.

LIST OF REFERENCE NUMERALS 10 circuit board to be tested
11 connection socket to be tested
111 electrical connection portion
20 adapter card
21 plug end
211 pin socket
212 connection pin
213 bottom surface
214 top surface
22 adapter socket
221 pin position
30 testing device
F external force

DETAILED DESCRIPTION OF THE PREFERRED EMBODIMENTS

The following diagram and embodiments will be used to explain the implementation mode of the disclosure in detail, so that the realization process of how the disclosure applies technical means to solve technical problems and achieve technical efficacy can be fully understood and implemented.

Figure 4:
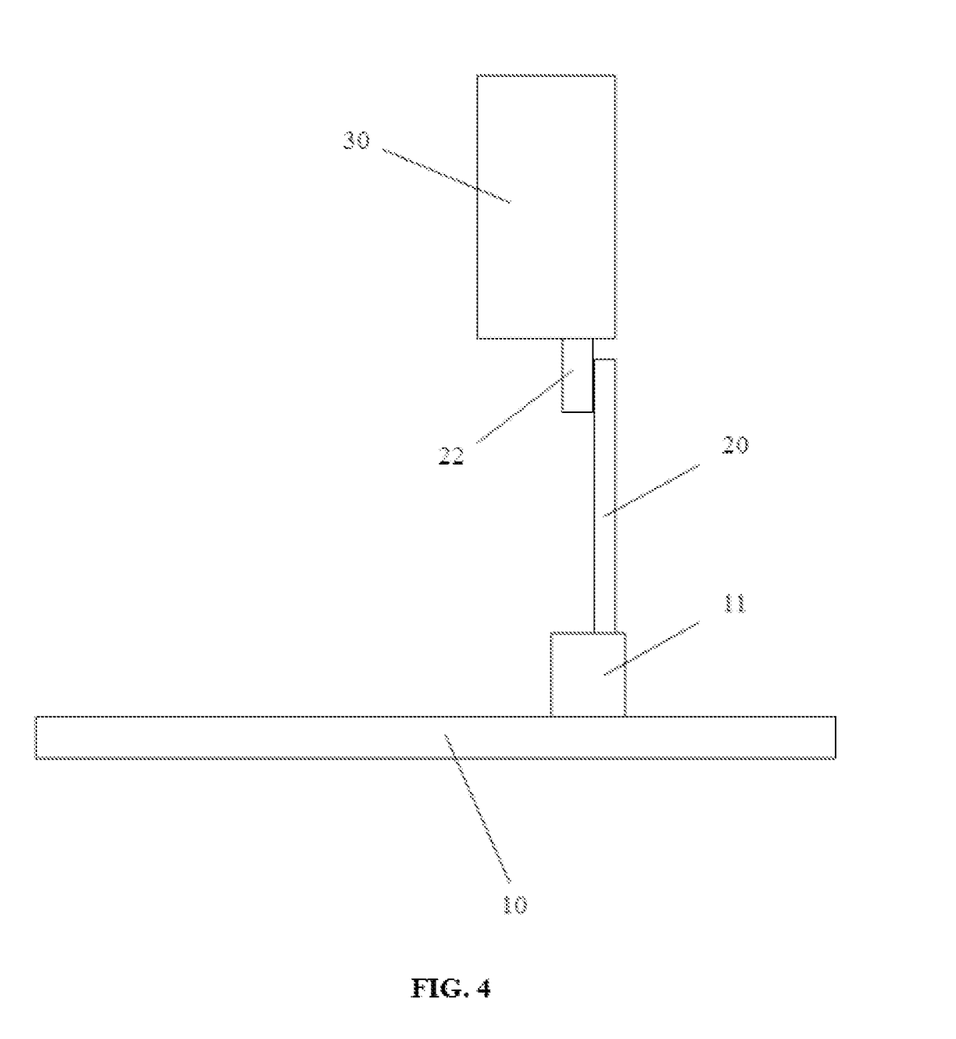
FIG. 4 is a schematic diagram of system architecture for improving test stability according to the present disclosure.

The following will describe the test system for improving test stability in the present disclosure. Please referring to FIG. 4, FIG. 4 is a system architecture diagram for improving test stability according to the present disclosure.

The test system for improving test stability in the present disclosure includes: a circuit board to be tested 10, an adapter card 20, and a testing device 30.

The circuit board to be tested 10 has at least one connection socket to be tested 11. The connection socket to be tested 11 may be a Universal Serial Bus (USB) female socket, which is merely an example, and does not limit to scope of application of the disclosure.

Figure 5:
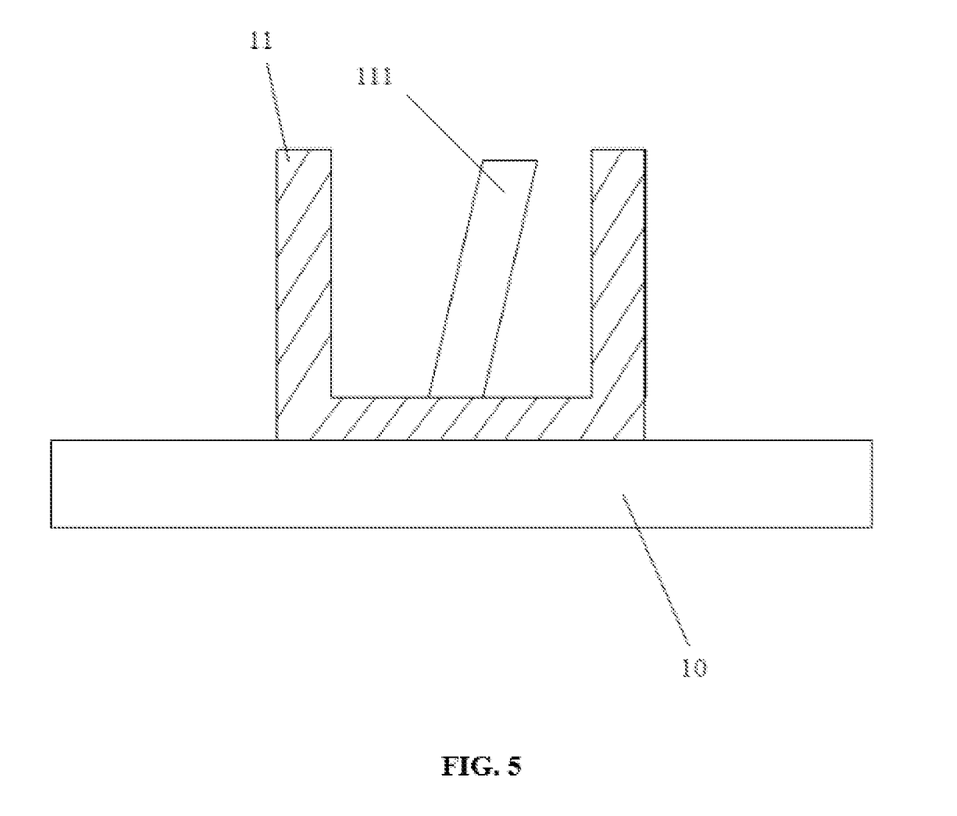
FIG. 5 is a cross sectional view of the connection socket to be tested which improves test stability according to the present disclosure.

Please referring to FIG. 5, FIG. 5 is a cross-sectional view of the connection socket to be tested for improving test stability according to the present disclosure.

The connection socket to be tested 11 of the circuit board to be tested 10 may have production tolerances, assembly tolerances and the like, which is merely an example, and does not limit the application scope of the present disclosure. The tolerance will cause electrical connection portion 111 in the connection socket to be tested 11 to deviate or tile. The deviation or tile shown by the electrical connection portion 111 in the connection socket to be tested 11 in FIG. 5 is shown in an obvious form, and the actual deviation or tile in the electrical connection portion 111 of the socket to be tested 11 is not so obvious as that in FIG. 5.

Figure 6A:
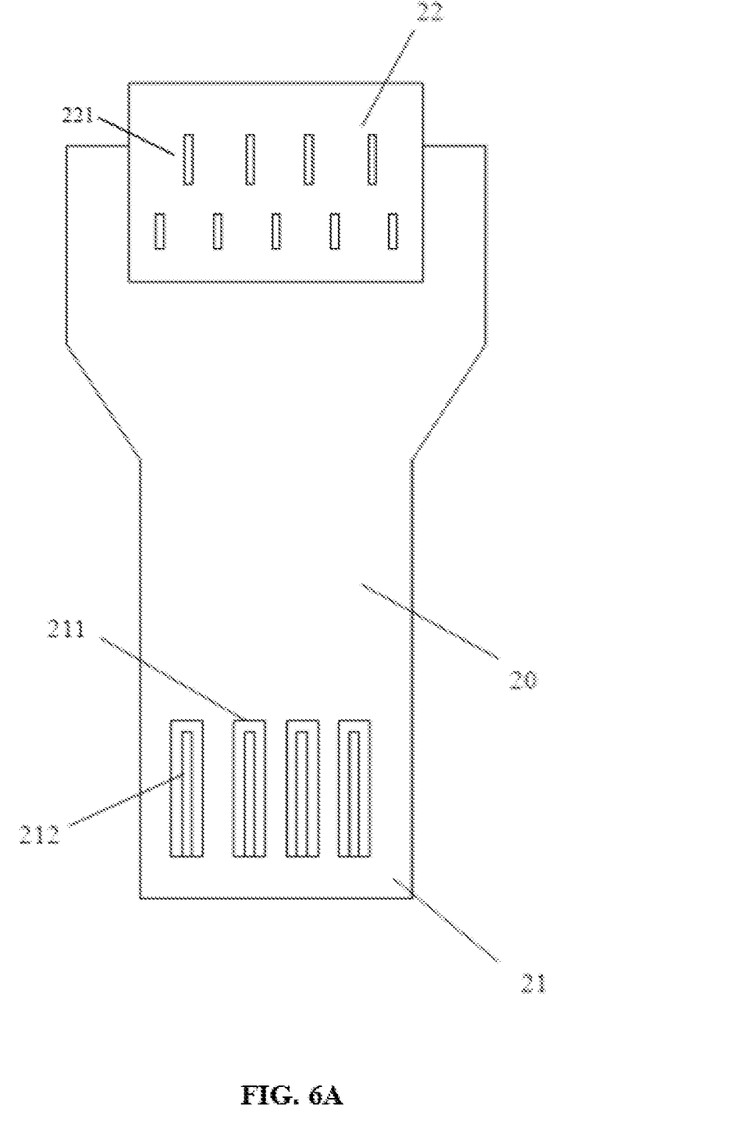
FIG. 6A is a planar view of an adapter card for improving test stability of the present disclosure.
Figure 6B:
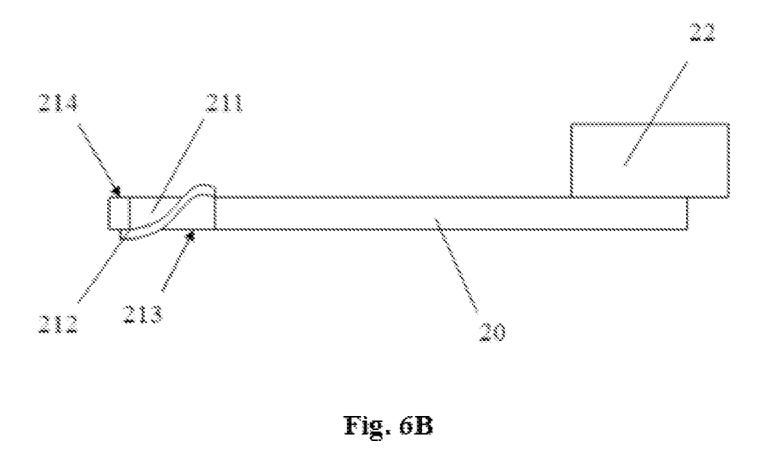
FIG. 6B is a cross sectional view of an adapter card for improving test stability of the present disclosure.

Please referring to FIG. 6A and FIG. 6B, FIG. 6A is a planar view of the adapter card for improving test stability according to the present disclosure; FIG. 6B is a cross-sectional view of the adapter card for improving test stability according to the present disclosure.

The plug end 21 of the adapter card 20 has a plurality of pin sockets 211 and a plurality of connection pins 212. One end of each connection pin 212 is fixed to the bottom surface 213 of the corresponding pin socket 211, the bottom surface 213 is near the end of the plug end 21, the other end of the connection pin 212 is disposed in the corresponding pin socket 211 and the other end of the connection pin 212 protrudes from the top surface 214 of the plug end 21. The plug end 21 of the adapter card 20 is used for plugging into the connection socket to be tested 11 of the circuit board to be tested 10.

Each pin of the adapter sockets 22 of the adapter card 20 is electrically connected to one of the connection pins 212 of the plug end 21. It should be noted that the connector pin 212 of the plug end 21 is USB interface, and the adapter socket 22 of the adapter card 20 is also a USB female socket, which is merely an example, and does not limit the scope of application of the disclosure.

Figure 7A:
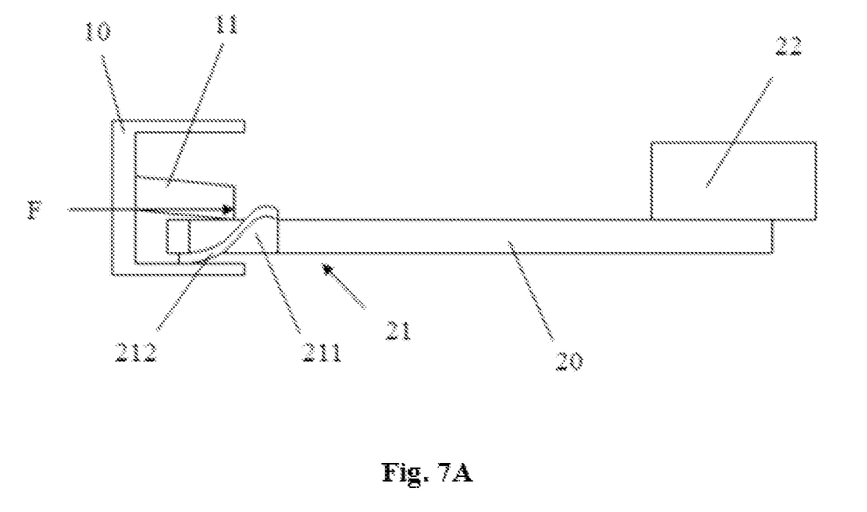
FIG. 7A and FIG. 7B are flow charts of the plug-in process of the connection socket to be tested which improves test stability according to the present disclosure and adapter card.
Figure 7B:
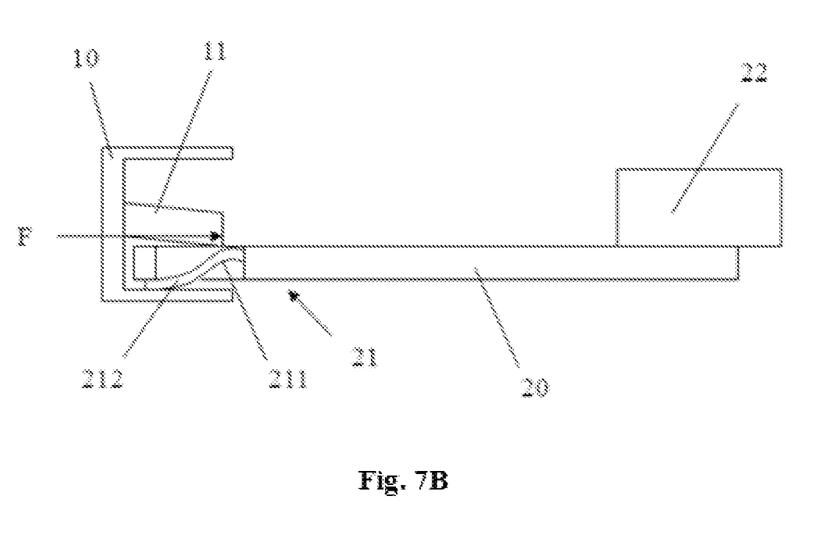

Please referring to FIG. 7A and FIG. 7B, FIG. 7A and FIG. 7B are flow charts of the plug-in process of the connection socket to be tested which improves test stability according to the present disclosure and adapter card.

FIG. 7A-7B are flow charts shows the connection pins 212 of the plug end 21 are plugged into the connection socket 11 of the circuit board to be tested 10. The connection pins 212 of the plug end 21 are plugged into the connection socket 11 of the circuit board to be tested 10. The electrical connection portion 111 of the connection socket to be tested 11 is contact with the connection pins 212 of plug end 21. One end of the connection pins 212 of the plug end 21 is fixed to the bottom surface 213 of the corresponding pin socket 211, the bottom surface 213 is near the end of the plug end 21. When subjected to the external force F, the connection pin 212 of the plug end 21 will move downwards, so that portion of the other end of the connection pin 212 is plugged into the corresponding pin socket 211 of the plug end 21. In the conventional technology, one end of the connection pin 212 of the plug end 21 is fixed to the top surface 214 of the corresponding pin socket 211, the top surface 214 is away from the plug end 21, this will cause the connection pin 212 be squeezed by external force, and cannot provide electrical connection for testing. The present disclosure can prevent the problem in the conventional technology. In the present application, the connection pin 212 of the plugging end 21 provides electrical connection between the corresponding pin 212 and the corresponding pin position in the electrical connection portion 111 of the connecting socket to be tested 11 by its own elasticity, so as to improve test stability.

It should be noted that the adapter card 20 is a multi-layer circuit board. That is, each the adapter socket 22 of the adapter card 20 is electrically connected with one of the connection pins 211 in the plug end 21 of the adapter card 20 on the inner layer of the circuit board of the adapter card 20, or each adapter socket 22 of the adapter card 20 is electrically connected with one of the connection pins 211 in the plug end 21 of the adapter card 20 on the inner layer of the circuit board of the adapter card 20.

Referring to FIG. 4 again, the plug end 21 of the adapter card 20 is plugged into the connection socket to be tested 11 of the circuit board to be tested 10 to form an electrical connection, and the testing device 30 is plugged into the adapter socket 22 of the adapter card 20 to form an electrical connection, so that the testing device 30 can test the connection socket to be tested 11 of the test circuit board to be tested 10 through the adapter card 20.

It should be noted that the testing device 30 can be directly connected to the adapter socket 22 of the adapter card 20 through the male end of the USB to form the electrical connection, and the testing device 30 can also be connected to the adapter socket 22 of the adapter card 20 to form an electrical connection through the male connector of the USB, which is merely an example, and does not limit the scope of the disclosure.

In summary, it can be seen that in the present disclosure, one end of the connection pin is fixed to the bottom surface of the corresponding pin socket, the bottom surface is near the end of the plug end, and the other end of each connection pin is disposed in the corresponding pin socket and portion of the connection pin protrudes from the top surface of the end of the plug end, so that the connection pin in the plug end will not be deformed by external force.

The conventional connection pins are susceptible to deform by external force, consequently cannot be used to perform electrical connection and the following test. The present disclosure has solved this problem, and prevents the connection pins from being deformed by external force, thereby ensuring the electrical connection and the test stability.

Although the embodiments of the present disclosure are described as above, it is not intended to limit the scope of the disclosure. Without departing from the spirit and scope stated by the disclosure, any changes in the form and details of the present application made by the person skilled in the art should be scope of the disclosure. The scope of the disclosure shall still be subject to the scope defined in the claims.

The invention claimed is:

1. A test system for improving testing stability, comprising:
   a circuit board to be tested, wherein the circuit board to be tested includes at least one connection socket to be tested; and
   an adapter card, wherein the adapter card comprises:
   a plug end, the plug end includes a plurality of pin sockets and a plurality of connection pins, one end of each connection pin is fixed to a bottom surface of a corresponding pin socket, the bottom surface is near an end of the plug end, the other end of each connection pin is disposed in the corresponding pin socket and a portion of the other end of the connection pin protrudes from a top surface of an end of the plug end, the plug end is plugged into the connection socket to be tested;
   an adapt socket, each pin position of the adapter socket is electrically connected with one of the comedian pins of the plug end; and
   a testing device, the testing device is plugged into and electrically connected with the adapter socket, so that the circuit board to be tested is tested by the adapter card.

2. The test system for improving test stability according to claim 1, wherein the connection socket to be tested is a universal serial bus female socket.

3. The test system for improving test stability of claim 2, wherein the plurality of connection pins of the plug end are universal serial bus interfaces.

4. The test system for improving test stability of claim 3, wherein the adapter socket is a universal serial bus interface.

5. The test system for improving test stability according to claim 4, wherein the testing device is plugged into and electrically connected with the adapter socket through a universal serial bus interface, so that the circuit board to be tested is tested by the adapter card.

6. The test system for improving test stability of claim 1, wherein the adapter card is a multilayer circuit board.

* * * * *